United States Patent
Komninakis et al.

(10) Patent No.: US 8,132,041 B2
(45) Date of Patent: Mar. 6, 2012

(54) METHOD AND APPARATUS FOR GENERATING OR UTILIZING ONE OR MORE CYCLE-SWALLOWED CLOCK SIGNALS

(75) Inventors: Christos Komninakis, La Jolla, CA (US); Ming-Chieh Kuo, Encinitas, CA (US)

(73) Assignee: Qualcomm Incorporated, San Diego, CA (US)

( * ) Notice: Subject to any disclaimer, the term of this patent is extended or adjusted under 35 U.S.C. 154(b) by 881 days.

(21) Appl. No.: 12/053,433

(22) Filed: Mar. 21, 2008

(65) Prior Publication Data
US 2009/0164827 A1 Jun. 25, 2009

Related U.S. Application Data

(60) Provisional application No. 61/015,267, filed on Dec. 20, 2007.

(51) Int. Cl.
*G06F 1/00* (2006.01)
*G06F 1/04* (2006.01)
*G06F 1/12* (2006.01)
*G06F 5/06* (2006.01)
*G06F 11/00* (2006.01)
*H04L 7/00* (2006.01)
*H04L 25/40* (2006.01)

(52) U.S. Cl. ........ 713/503; 713/500; 713/600; 375/354; 375/371; 375/372

(58) Field of Classification Search ................... 713/500, 713/503, 600; 375/354, 371, 372
See application file for complete search history.

(56) References Cited

U.S. PATENT DOCUMENTS

| | | | | |
|---|---|---|---|---|
| 3,928,813 A | * | 12/1975 | Kingsford-Smith | 331/1 A |
| 3,976,945 A | * | 8/1976 | Cox | 327/107 |
| 4,214,823 A | * | 7/1980 | Pritchard | 352/87 |
| 4,521,916 A | * | 6/1985 | Wine | 455/182.1 |
| 4,586,005 A | * | 4/1986 | Crawford | 331/1 A |
| 4,868,513 A | * | 9/1989 | Piercy et al. | 327/156 |
| 5,075,880 A | * | 12/1991 | Moses et al. | 708/313 |
| 5,517,521 A | * | 5/1996 | Strawn | 375/219 |
| 5,578,968 A | * | 11/1996 | Mori et al. | 331/1 A |
| 5,907,295 A | * | 5/1999 | Lin | 341/61 |
| 6,016,113 A | * | 1/2000 | Binder | 341/131 |

(Continued)

OTHER PUBLICATIONS

Hamila R et al: "Effect of frequency offset on carrier phase and symbol timing recovery in digital receivers" Signals, Systems, and Electronics, 1998. ISSSE 98. 1998 URSI Internati Onal Symposium on Pisa, Italy Sep. 29-Oct. 2, 1998, New York, NY, USA,IEEE, US, Sep. 29, 1998, pp. 247-252, XP010316745 ISBN: 978-0-7803-4900-1 the whole document.

(Continued)

*Primary Examiner* — Mark Connolly
(74) *Attorney, Agent, or Firm* — Larry J. Moskowitz; Eric Ho

(57) ABSTRACT

An electronic device is provided for generating or utilizing one or more cycle-swallowed clock signals derived based on one or more first clock signals. The device includes a module configured to receive a first clock signal having a first frequency. The module is configured to generate a second clock signal having a second frequency and configured to swallow one or more clock cycles of the first clock signal in generating the second clock signal. The first clock signal has even cycles, and the second clock signal has uneven cycles. The first frequency is greater than the second frequency. The module may include a cycle-swallowing counter. A method and a computer-readable medium are also provided.

50 Claims, 10 Drawing Sheets

U.S. PATENT DOCUMENTS

| | | |
|---|---|---|
| 6,167,097 A | 12/2000 | Marston et al. |
| 6,289,067 B1 | 9/2001 | Nguyen et al. |
| 6,424,688 B1 * | 7/2002 | Tan et al. .................. 375/354 |
| 6,518,894 B2 | 2/2003 | Freidhof |
| 6,748,039 B1 * | 6/2004 | Bates .................. 375/354 |
| 6,792,060 B1 | 9/2004 | Dujardin et al. |
| 2009/0063888 A1 * | 3/2009 | Gold et al. .................. 713/501 |
| 2009/0150709 A1 * | 6/2009 | Arnold et al. .................. 713/600 |

OTHER PUBLICATIONS

International Search Report & Written Opinion—PCT/US2008/087609, International Search Authority—European Patent Office—Apr. 23, 2009.

* cited by examiner

METHOD AND APPARATUS FOR GENERATING OR UTILIZING ONE OR MORE CYCLE-SWALLOWED CLOCK SIGNALS

CLAIM OF PRIORITY UNDER 35 U.S.C. §119

The present application for patent claims priority to Provisional Application No. 61/015,267 entitled "METHOD AND APPARATUS FOR GENERATING OR UTILIZING ONE OR MORE CYCLE-SWALLOWED CLOCK SIGNALS" filed Dec. 20, 2007, and assigned to the assignee hereof and hereby expressly incorporated by reference herein.

BACKGROUND

1. Field

The subject technology relates generally to electronic devices and clock generation or utilization, and more specifically to methods and apparatus for generating or utilizing one or more cycle-swallowed clock signals.

2. Background

One approach to generate all of the clock signals needed in modern electronic devices is to employ different phase-locked loops (PLLs) for different clocks, or one PLL for the least-common multiple of the desired clock frequencies as a reference so that one can obtain each of the desired clock signals using frequency dividers. This is impractical from the area/power standpoint. Furthermore, reference frequencies may drift as a result of a frequency drift of a crystal oscillator, temperature variations, and/or supply voltage variations, leading to non-integer division ratios, which are difficult to implement.

SUMMARY

In one aspect of the disclosure, an electronic device is provided for generating or utilizing one or more cycle-swallowed clock signals derived based on one or more first clock signals. The device comprises a module configured to receive a first clock signal having a first frequency. The module is configured to generate a second clock signal having a second frequency and configured to swallow one or more clock cycles of the first clock signal in generating the second clock signal. The first clock signal has even cycles, and the second clock signal has uneven cycles. The first frequency is greater than the second frequency.

In a further aspect of the disclosure, an electronic device is provided for generating or utilizing one or more cycle-swallowed clock signals derived based on one or more first clock signals. The device comprises a cycle-swallowing counter configured to be clocked by a first clock signal having a first frequency. The cycle-swallowing counter is configured to generate a second clock signal having a second frequency and configured to swallow one or more clock cycles of the first clock signal in generating the second clock signal. The first frequency is greater than the second frequency.

In yet a further aspect of the disclosure, a method is provided for generating or utilizing one or more cycle-swallowed clock signals derived based on one or more first clock signals. The method comprises receiving a first clock signal having a first frequency and generating a second clock signal having a second frequency. The first clock signal has even cycle, the second clock signal has uneven cycles, and the second frequency is less than the first frequency. The generating comprises swallowing one or more clock cycles of the first clock signal.

In yet a further aspect of the disclosure, an electronic device is provided for generating or utilizing one or more cycle-swallowed clock signals derived based on one or more first clock signals. The electronic device comprises means for receiving a first clock signal having a first frequency and means for generating a second clock signal having a second frequency. The first clock signal has even cycles, the second clock signal has uneven cycles, and the second frequency is less than the first frequency. The means for generating comprises means for swallowing one or more clock cycles of the first clock signal.

In yet a further aspect of the disclosure, a computer-readable medium comprises instructions executable by a processing system in an electronic device. The instructions comprise code for determining a content of a cycle-swallowing counter and determining a second series of data resampled from a first series of data. The second series of data is determined based on the content of the cycle-swallowing counter. The cycle-swallowing counter is configured to receive a first clock signal having a first frequency, configured to generate a second clock signal having a second frequency, and configured to swallow one or more clock cycles of the first clock signal in generating the second clock signal. The second series of data is clocked by the first clock signal, if the first series of data is clocked by the second clock signal, and the second series of data is clocked by the second clock signal, if the first series of data is clocked by the first clock signal. The content of the cycle-swallowing counter is determined based on the first and second frequencies.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology.

Figure 1:
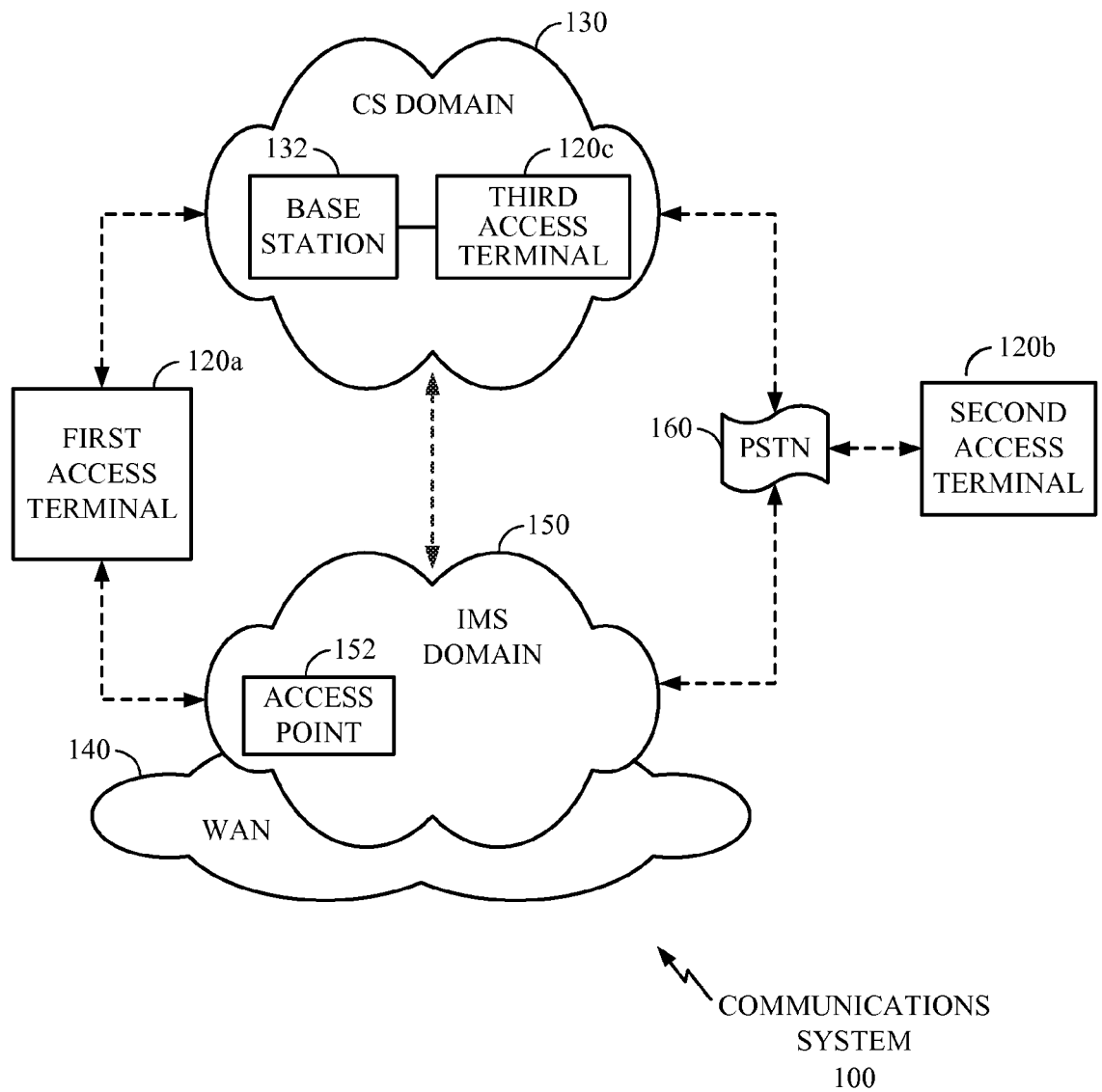
FIG. 1 is a conceptual block diagram illustrating an example of a communications system according to one aspect of the disclosure.

FIG. 1 is an exemplary block diagram of a configuration of a communications system 100. The communications system 100 may include a first access terminal 120a, a second access terminal 120b, and a third access terminal 120c.

An access terminal may be any suitable electronic device such as a wireless telephone, a wired telephone, a laptop computer, a desktop computer, a personal digital assistant (PDA), a data transceiver, a modem, a pager, a camera, a game console, an MPEG Audio Layer-3 (MP3) player, a media gateway system, an audio communications device, a video communications device, a multimedia communications device, a component of any of the foregoing devices (e.g., a printed circuit board(s), an integrated circuit(s), or a circuit component(s)), or any other electronic device. An access terminal may be referred to by those skilled in the art as a handset, wireless communications device, wireless telephone, cellular telephone, wired communications device, wired telephone, user terminal, user equipment, mobile station, mobile unit, subscriber unit, subscriber station, wireless station, mobile radio, radio telephone, or some other terminology.

In FIG. 1, the first access terminal 120a may be a wireless telephone, the second access terminal 120b may be a wired telephone, and the third access terminal 120c may be a media gateway system according to one aspect. The communications system 100 may further include a circuit-switched (CS) domain 130, an Internet Protocol multimedia subsystem (IMS) domain 150, and a public switched telephone network (PSTN) 160. The IMS domain 150 may overlap with a wide area network (WAN) 140, such as the Internet.

The CS domain 130 may include a base station 132, and the IMS domain 150 may include an access point 152. The third access terminal 120c may be included in the CS domain 130. Each of the CS domain 130 and the IMS domain 150 may also include other well known components for transmitting, receiving and processing signals or other electronic devices, but they are not shown to avoid obscuring the concepts described herein. The access terminal 120b may be connected to the PSTN 160 or a cable modem (not shown) and coupled to the CS domain 130, the IMS domain 150, and the WAN 140.

A CS domain may be, for example, a cellular domain. A CS domain may support a cellular communications network such as second-generation wireless or cellular technologies (2G), third-generation wireless or cellular technologies (3G), fourth-generation wireless or cellular technologies (4G), cellular code division multiple access (CDMA), wideband code division multiple access (WCDMA), time division multiple access (TDMA), frequency division multiple access (FDMA), orthogonal frequency division multiple access (OFDMA), CDMA 2000 EV-DO, CDMA 2000 1XRTT, Global System for Mobile Communications (GSM), Ultra Mobile Broadband (UMB), or any other suitable cellular technologies. A CS domain 130 may also support a wired communications network in conjunction with a cellular communications network.

An IMS domain may support a wireless communications network such as a wide area network (WAN), a wireless local area network (WLAN), World Interoperability for Microwave Access (WiMAX), wireless fidelity (Wi-Fi), Institute for Electrical and Electronic Engineers (IEEE) 802.11, Bluetooth-based Wireless Personal Area Network (WPAN), ultra-wideband (UWB), Long Term Evolution (LTE), home radio frequency (HomeRF), or any other suitable wireless communications network. An IMS domain 150 may also support a wired communications network (e.g., a wired local area network (LAN)) in conjunction with a wireless communications network.

The first access terminal 120a may communicate with the second access terminal 120b using the CS domain 130 or the IMS domain 150. When the first access terminal 120a uses the CS domain 130, the first access terminal 120a may utilize the base station 132, which allows the first access terminal 120a to communicate with devices within the CS domain 130 and devices connected to the CS domain 130 (e.g., the second access terminal 120b). When the first access terminal 120a uses the IMS domain 150, it may utilize the access point 152, which allows the first access terminal 120a to communicate with devices within the IMS domain 150 and devices connected to the IMS domain 150 (e.g., the second access terminal 120b). While the communications system 100 has been illustrated with one CS domain and one IMS domain, the communication system 100 may include multiple CS domains, multiple IMS domains, multiple base stations, multiple access points, multiple PSTNs and/or additional access terminals.

Each of the CS domain 130, the IMS domain 150, the PSTN 160, and the WAN 140 may include one or more electronic devices. Each of the base station 132 and the first, second and third access terminals 120a, 120b, and 120c may be an electronic device or may include multiple electronic devices.

Figure 2:
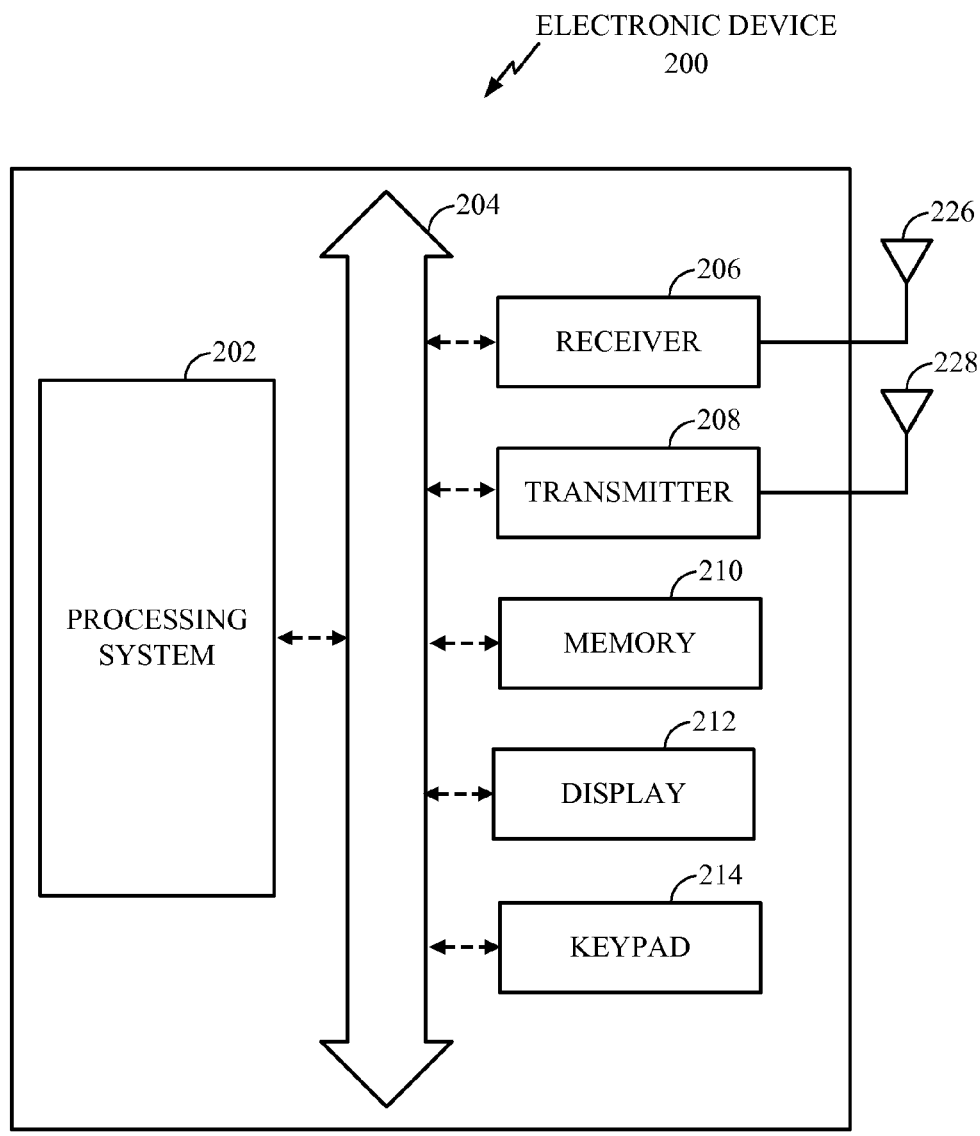
FIG. 2 is a conceptual block diagram illustrating an example of a hardware configuration of an electronic device according to one aspect of the disclosure.

FIG. 2 is a conceptual block diagram illustrating an example of an electronic device. An electronic device 200 includes a processing system 202, which is capable of communication with a receiver 206 and a transmitter 208 through a bus 204 or other structures or devices. The receiver 206 may receive signals from an antenna 226, and the transmitter 208 may transmit signals using an antenna 228. It should be understood that communication means other than buses can be utilized with the disclosed configurations. The processing system 202 can generate audio, video, multimedia, and/or other types of data to be provided to the transmitter 208 for communication. In addition, audio, video, multimedia, and/or other types of data can be received at the receiver 206, and processed by the processing system 202.

Software programs, which may be stored in the memory 210 or the processing system 202, may be used by the processing system 202 to control and manage access to the various networks, as well as provide other communication and processing functions. Software programs may also provide an interface to the processing system 202 for various user interface devices, such as a display 212 and a keypad 214.

The processing system 202 may be implemented using software, hardware, or a combination of both. By way of example, the processing system 202 may be implemented with one or more processors. A processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or any other suitable device that can perform calculations or other manipulations of information. The processing system 202 may also include one or more computer-readable media for storing software. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

While FIG. 2 shows two separate antennas 226 and 228, an electronic device may employ one common antenna for both the receiver 206 and the transmitter 208, or may employ multiple antennas (e.g., each or one of the receiver 206 and the transmitter 208 may include more than one antenna). An electronic device may also include other components that are not shown in FIG. 2 (e.g., peripheral devices) or may include fewer components than what is shown in FIG. 2. The receiver 206 and the transmitter 208 may be combined into a transceiver in another configuration. Some of the functions of the processing system 202 may be performed by one or more of the other blocks shown in FIG. 2, such as the receiver 206 and the transmitter 208, and some of the functions of the receiver 206 and/or the transmitter 208 may be performed by one or more of the other blocks, such as the processing system 202. The communications system and the electronic device shown in FIGS. 1 and 2 are merely examples, and the subject technology may be practiced in other types of communications systems and other devices.

Figure 3:
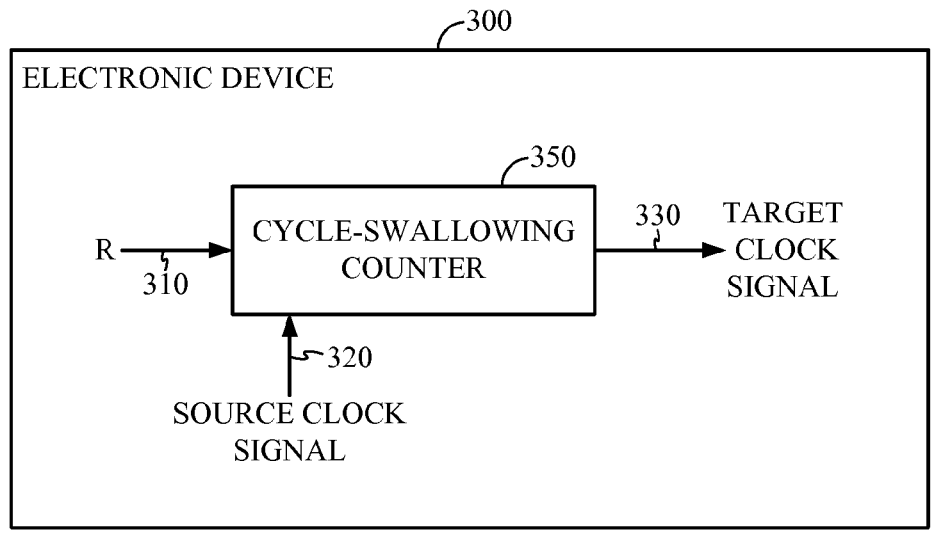
FIG. 3 is a conceptual block diagram illustrating an exemplary configuration of an electronic device having a cycle-swallowing counter according to one aspect of the disclosure.

FIG. 3 is another conceptual block diagram illustrating an example of an electronic device. An electronic device 300 includes a cycle-swallowing counter 350. It can receive an increment value, R 310, as an input. The cycle-swallowing counter 350 can also receive a source clock signal 320, which is used to clock the cycle-swallowing counter 350. The cycle-swallowing counter 350 may provide, as an output, a target clock signal 330, which may be generated based on R 310 and the source clock signal 320. The electronic device 300 may include some or all of the components shown in FIG. 2, or alternatively, the components shown in FIG. 3 may be incorporated into some of the components shown in FIG. 2. For example, the cycle-swallowing counter 350 may be incorporated into the processing system 202, the receiver 206, the transmitter 208, or some combination thereof.

Figure 4:
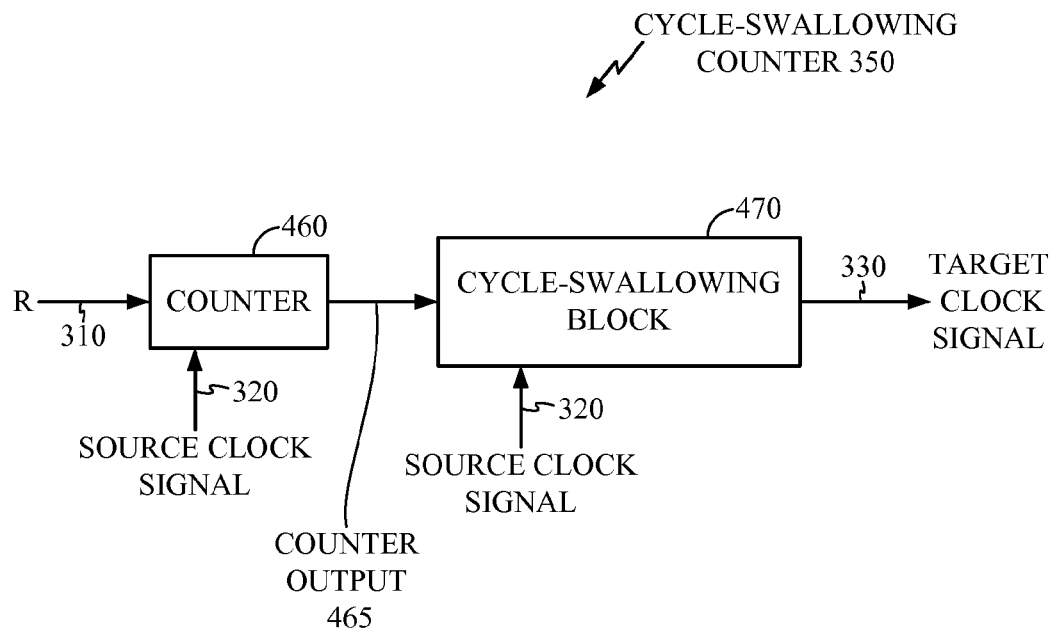
FIG. 4 is a conceptual block diagram illustrating an exemplary configuration of a cycle-swallowing counter according to one aspect of the disclosure.

FIG. 4 is a conceptual block diagram illustrating an example of a cycle-swallowing counter. The cycle-swallowing counter 350 may include a counter 460, which may be a modulo-N counter, and a cycle-swallowing block 470. The counter 460 can receive R 310, can be clocked using the source clock signal 320, and can produce a counter output 465. The cycle-swallowing block 470 may swallow (e.g., omit or eliminate) one or more cycles of the source clock signal 320 and produce the target clock signal 330. The operation of a cycle-swallowing counter is described in detail below.

In one aspect of the disclosure, a cycle-swallowing counter provides a novel and simple but powerful mechanism to generate synchronous clocks and data from a source clock signal whose frequency is not harmonically related to the frequencies of the target clock signals (e.g., the desired frequencies). When the frequency of the source clock signal (source frequency) and the frequencies of the target clock signals (target frequencies) are not harmonically related, the source and target frequencies are, for example, not multiples of each other. Multiple target clock signals may be generated from, for example, a single source clock signal, utilizing multiple cycle-swallowing counters. Each cycle-swallowing counter may generate its corresponding target clock signal. The target clock signals may be digital clock signals.

A cycle-swallowing counter can also correct for potential frequency drifts (sometimes referred to as frequency offsets) present in a source clock signal. For example, the frequency of a source clock signal may drift (or change) with time due to a frequency drift of a crystal oscillator. A cycle-swallowing counter may automatically correct for this frequency drift. It should be noted that the subject technology is applicable to a source clock signal that has a frequency drift, to a source clock that potentially has a frequency drift (e.g., a source clock signal whose frequency may potentially drift), as well to a source clock signal that does not have a frequency drift.

A cycle-swallowing counter may also be used to interpolate digital data from one clock domain to another clock domain with arbitrarily high accuracy.

In modern multi-standard and multi-mode transceivers, often integrated on the same chip, the need invariably arises to efficiently generate different target clocking frequencies from sources (or from a single source), which is not (or cannot be) harmonically related to all the target frequencies. The term "multi-standard" may refer to multiple protocols, such as CDMA, GSM, and global positioning system (GPS). The term "multi-mode" may refer to protocols that are the same standard but different versions of the standard that require different clocking frequencies. An example of multi-mode protocols may include WCDMA 1999 and high-speed downlink packet access (HSDPA) 2003.

Baseband processing of signals is most conveniently performed at some integer multiple of the symbol rate. For example, WCDMA baseband circuitry is clocked at K×3.84 MHz, where K can be 2, 4, 8, 16, etc., while in CDMA, the clocks are K×1.2288 MHz, and GSM/EDGE/GPRS baseband circuitry is clocked at L×270.8333 kHz, where L is as high as 96 or sometimes 192.

In one aspect of the disclosure, a cycle-swallowing implementation provides a simple clock generation mechanism that is efficient because it requires simple hardware (e.g., a counter) that can deal with frequency drifts, and that can lend itself naturally to digital data resampling of arbitrarily good quality.

In one aspect of the disclosure, the frequency of a source clock signal (source frequency) is greater than the frequency of a target clock signal (target frequency) (i.e., the source frequency is higher than the target frequency). In other words, $f_{targ} < f_{src}$, where $f_{targ}$ is the target frequency, and $f_{src}$ is the source frequency. This criterion can be easily achieved on practical designs since more than one submultiples of the clock frequencies are usually sought. In another exemplary configuration, the source frequency is greater than the target frequency, but the source frequency is less than twice the target frequency. In yet another exemplary configuration, the source frequency is greater than the target frequency but less than three times the target frequency. It should be noted that these are merely some illustrative examples, and the subject technology is not limited to these examples.

Functionality of Cycle-Swallowing

Figure 5:
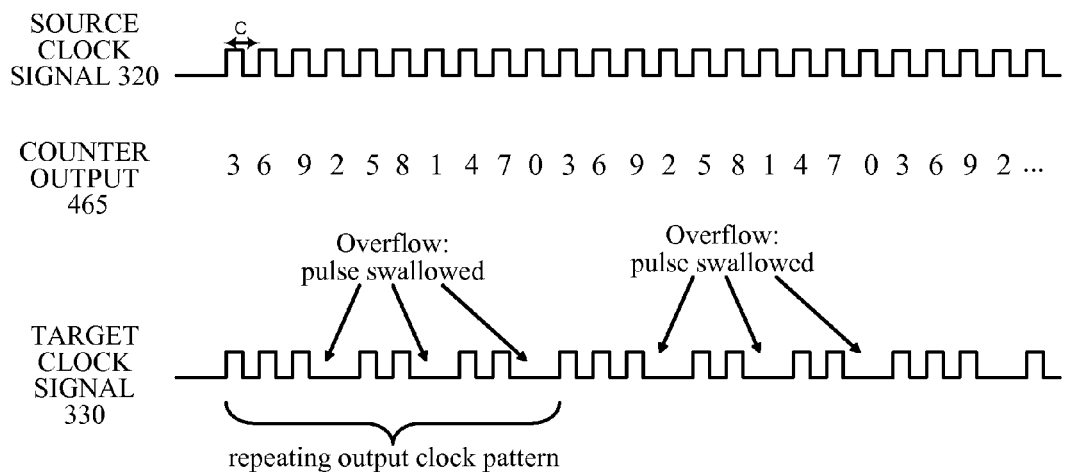
FIG. 5 illustrates an exemplary source clock signal, exemplary counter contents, and an exemplary target clock signal according to one aspect of the disclosure.

As shown in FIGS. 3, 4, and 5, a cycle-swallowing counter 350 can be clocked by a source clock signal 320, and incremented as calculated below (depending on the target frequency). The cycle-swallowing counter 350 may simply increment at every clock cycle of the source clock signal 320 (e.g., clock cycle C shown in FIG. 5), and whenever the counter 460 overflows (turns over), the cycle-swallowing block 470 can swallow (e.g., omit or eliminate) a clock cycle (or pulse) of the source clock signal 320. In other words, a clock pulse (or cycle) from the target clock signal 330 is swallowed (e.g., omitted or eliminated), as illustrated in FIG. 5. When one or more clock cycles or pulses of a source clock signal are swallowed, this can be viewed as swallowing one or more clock pulses or cycles from a target clock signal.

In one aspect of the disclosure, a target clock signal can be viewed as the same as a source clock signal, but with several cycles or pulses (ticks) missing. A target clock signal may be viewed as a cycle-swallowed clock signal in that one or more clock cycles or pulses are swallowed (e.g., omitted, eliminated or missing). A target clock signal 330 has the desired target frequency that does not change with time on the average and is thus constant on the average. The target clock signal can also remain synchronous with the source clock signal 320, often a very desirable property for maintaining system time. Depending on the cycle-swallowing mechanism, a target clock signal 330 can maintain accurate average frequency even as the source clock signal 320 drifts with a frequency-offset. This is important in practical modems, which need to correct for frequency drifts because of crystal oscillator, temperature and/or supply variations. Furthermore, the content of a cycle-swallowing counter 350 (e.g., the counter output 465) at every time is a number that naturally aids a resampling circuit with arbitrarily good resampling performance, depending on design complexity, as described further in detail later.

Referring to FIGS. 3, 4, and 5, an exemplary operation of a cycle-swallowing counter is illustrated below. Suppose a source clock signal 320 has a frequency of 100 ($f_{in}$=100). The unit of frequency is Hertz (e.g., MHz, GHz, kHz), but since units do not affect the analysis, they are not mentioned in this example. Suppose the desired frequency of a target clock signal 330 is 70 ($f_{out}$=70). Then, in this example, N=10, M=7, R=N−M=3. In general, N and M may be the integers whose ratio N/M most closely approximates the ratio of the source and target frequencies ($f_{in}/f_{out}$). In one example, the smallest possible integers that meet the above criteria may be selected for N and M. In another example, the largest possible integers that meet the above criteria may be selected for N and M, and such selection may be beneficial for fine frequency adjustments. A cycle-swallowing counter 350 prevents R (which is 3 in this example) out of every N (which is 10 in this example) source clock pulses from making it to the target clock signal (i.e., "swallow" R out of every N cycles of the source clock signal).

FIG. 5 illustrates a source clock signal 320, a counter output 465 and a target clock signal 330. A cycle-swallowing counter 350 can be incremented by R (which is N−M=3, in this example) at every tick (or every cycle) of the source clock signal 320 and overflow at N (which is 10 in this example). The target (or output) clock signal can be verified to have an average frequency equal to M/N (which is 70% in this case) of the source frequency.

Therefore, in this exemplary implementation, the cycle-swallowing counter 350 has an increment of R=3, and overflows at or above the value of N=10, in which case the counter cycles through the values listed in FIG. 5. The counter 460 may be simply a modulo-N counter, where N=10 in this example. The starting state of the counter 460 is irrelevant.

In practical exemplary implementation, instead of seeking a pair of integers N and M such that the rational fraction N/M=$f_{in}/f_{out}$, and then choosing R=N−M, one may implement a 32-bit counter (i.e., choose N=2^32) and then choose $$R = \text{round}\left[2^{32} \cdot \frac{f_{in} - f_{out}}{f_{in}}\right],$$

where $f_{in}$ is the source or input (available) frequency, and $f_{out}$ is the target (or output) frequency.

An overflow in a cycle-swallowing counter 350 can be detected in many different ways. One way is to detect an overflow by determining whether the value of the counter output 465 is less than the increment value (e.g., R=3 in this example). Another way may be to monitor the values of the counter output 465 and determine that an overflow has occurred when the current value of the counter output 465 is less than the previous value of the counter output 465. These are simply examples, and the subject technology is not limited to these examples.

Frequency Control

Still referring to FIGS. 3, 4, and 5, according to one aspect of the disclosure, a cycle-swallowing counter 350 can easily correct the frequency drift of a source clock signal 320, resulting in a frequency-stable target clock signal 330 on the average. In other words, the frequency of a target clock signal 330 (target frequency) is, on the average, more stable (or better controlled) than the frequency of a source clock signal 320 (source frequency). For example, assume that a source clock signal 320 drifts by 10%, such that its frequency becomes 110 (from 100), then a counter 460 can be programmed to increment by R=4, and to overflow (modulo-N) at N=11, in order to accommodate the source frequency drift. The average target frequency remains constant, for example, at 70. In other words, $f_{avg\ out}$=M/N·$f_{in}$, where $f_{avg\ out}$ is the average target frequency, $f_{in}$ is the source frequency, M is 7 in this case, and N is 10 in this case.

It should be noted that a frequency drift even for 10 parts-per-million (ppm) (0.001%) may affect the operation of an electronic device because, for example, a frequency drift of 10 ppm can cause a signal to drift into an adjacent frequency channel in which the electronic device is not permitted to operate. Thus, a frequency-stable target clock signal may have, for example, much less than 1 ppm in frequency drift (or frequency offset). In certain sensitive applications, such as GPS, the required clock accuracy is such that drift of even 1 part-per-billion (ppb) (which is 0.001 ppm) may negatively impact performance. Thus, for sensitive applications, the frequency drift amount of a frequency-stable target clock signal may be, for example, less than 1 ppb, 0.1 ppb, or 0.001 ppb, or even less. These frequency drift amounts described above are merely examples, and the subject technology is not limited to these examples.

The frequency drift in a target clock signal can reach zero if an automatic frequency control (AFC) module can estimate the frequency drift in the source clock signal accurately. The frequency stability of a target clock signal can depend on how accurately the AFC module can estimate the frequency drift in the source clock signal. If a source clock signal has a frequency drift, then a target clock signal may have a frequency drift that is less than, or much less than, the frequency drift of the source clock signal, or the target clock signal may have nearly a zero frequency drift or no frequency drift. A frequency-stable clock signal may be referred to as an always-frequency-stable clock signal, an accurately-frequency-controlled clock signal, a tightly-frequency-controlled clock signal, and/or an exactly-frequency-controlled clock signal.

According to one aspect of the disclosure, assuming that the frequency offset has been estimated by, for example, an automatic frequency control (AFC) module (see, e.g., AFC module 780 in FIG. 7), the handling of frequency offset may proceed, in general, as follows.

Assume that the nominal constants N, M, and R have been determined for a nominal pair of source and target frequencies ($f_{in}$, $f_{out}$). Now, assume that the AFC mechanism determines that the available frequency $f_{in}$ has drifted by X ppm, so that the actual source (or available) frequency has become: $f'_{in}=f_{in} \cdot (1+X \cdot 10^{-6})$. In this case, all that needs to be reprogrammed in a cycle-swallowing counter 350 is, for example, reprogramming N and R as N' and R', which can be expressed as the following:

$$N_e = \text{round}[N \cdot X \cdot 10^{-6}]$$

$$N' = N + N_e$$

$$R' = R + R_e$$

It can be shown that changing the nominal constants N, R, in the way shown above, can maintain a constant target frequency out of the cycle-swallowing counter 350. In other words, if an estimate of the frequency offset is available, the cycle-swallowing counter 350 can be reprogrammed and maintain stable target (or output) frequency (eliminating the drift) in a simple and efficient manner.

In one aspect of the disclosure, the potential or actual frequency drift of a source clock signal can be automatically compensated for in a target clock signal. A cycle-swallowing counter may be configured to adaptively or automatically to correct for the frequency drift in the source clock signal when generating the target clock signal. This may be based on one or more estimates of the frequency drift (or offset) derived from an AFC module.

Functionality of Resampling

Figure 6:
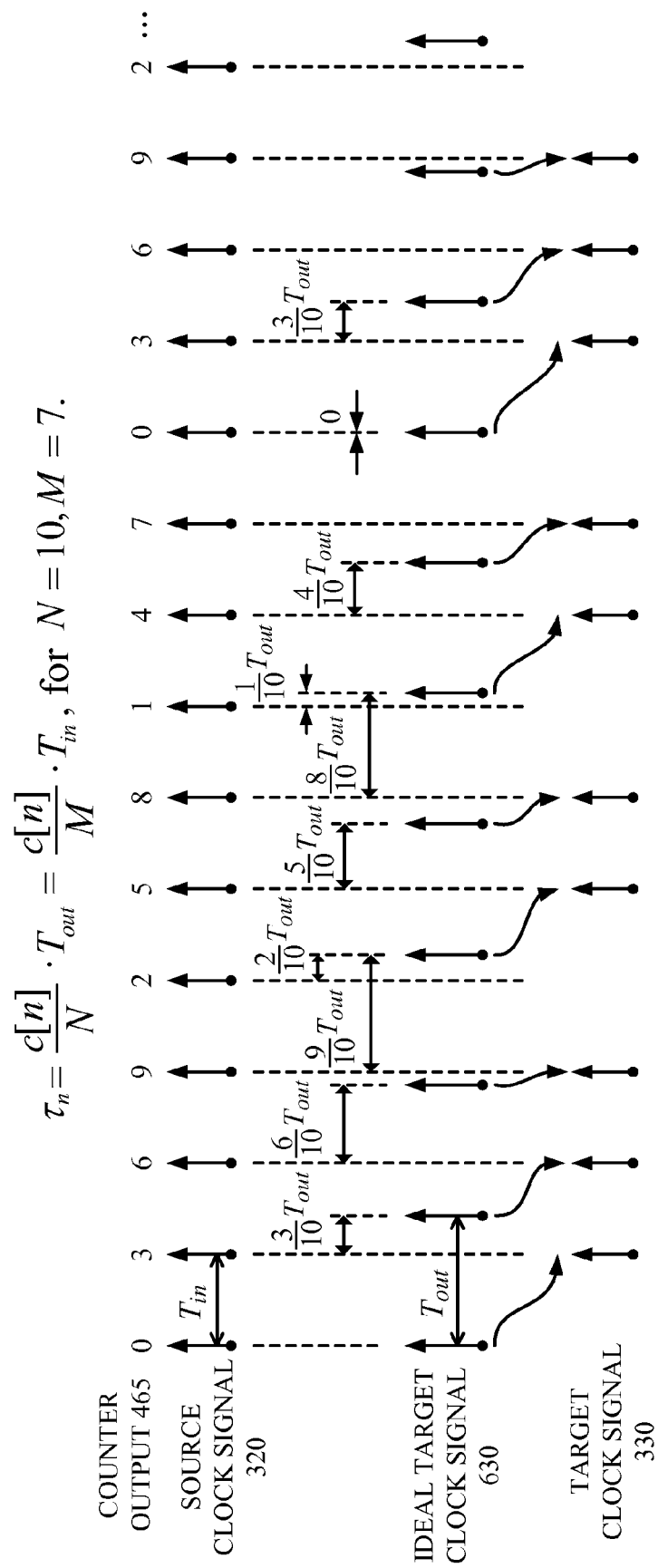
FIG. 6 illustrates exemplary resampling of data from one clock domain to another clock domain according to one aspect of the disclosure.

Now referring to FIGS. 3-6, in one aspect of the disclosure, a cycle-swallowing counter 350 can be used to resample data (e.g., digital data). This is possible because the counter content (e.g., a counter output 465) at any clock interval can represent the fractional time difference between the ticks of a hypothetical ideal target clock signal 630 having frequency $f_{out}$ (which is not available) and the ticks of the source clock signal 320 having frequency $f_{in}$. Effectively, the content of the cycle-swallowing counter 350 divided by the overflow limit (N), $$\tau_n = \frac{\{3,6,9,2,5,8,1,4,7,0\}}{10},$$

at any given time can provide the fraction of a hypothetical ideal target clock period $T_{out}=1/f_{out}$, by which the source clock signal 320 ticks (arriving regularly, with period $T_{in}=1/f_{in}$) would be displaced, as illustrated in FIG. 6. This is very useful for digital data resampling, because it can establish the timing relationship between the clock signals of existing and desirable (resampled) data.

Still referring to FIGS. 3-6, an exemplary resampling operation is illustrated. In this example, assume again $f_{in}=1/T_{in}=100$ and $f_{out}=70$. Then, as described above, a target clock signal 330 produced by a cycle-swallowing counter 350 has an average frequency of $f_{out}=70$, but its period is uneven and may vary between $T_{in}$ (unswallowed source clock period) and $2 \cdot T_{in}$ (swallowed source clock period). However, if an ideal target clock signal 630 with $f_{out}=70$ existed, it would tick every $$T_{out} = 1/70 = \frac{10}{7} \cdot T_{in} = \frac{N}{M} \cdot T_{in}$$

units of time. These hypothetical ticks of the ideal target clock signal 630 would be displaced from the regular (every $T_{in}$) ticks of the source clock signal 320 by the fractions of $T_{out}$ indicated by $\tau_n$ above, as shown in FIG. 6. Furthermore, digital data clocked at the ticks of a real target clock signal 330 can be viewed as clocked at the ticks of the hypothetical ideal target clock signal 630, as there is a one-to-one correspondence (or mapping) between them. The real target clock signal 330 and the ideal target clock signal 630 have identical average frequency $f_{out}$.

Knowledge of the contents of the cycle-swallowing counter 350 (e.g., $\tau$) enables interpolation of arbitrarily good quality, as the timing relationships between the available (or original) data and interpolated data are exactly known from the contents of the counter c[n] (interpreted as fractions, $$\tau_n = \frac{c[n]}{N} T_{out} = \frac{c[n]}{M} T_{in}\Big).$$

FIG. 6 illustrates the above example. In one aspect, there is a one-to-one correspondence (or mapping) between the ideal (non-existent) target clock signal 630 and the real target clock signal 330. Using the counter contents c[n] (e.g., a counter output 465) to identify the relative positions in time of available data and desired (or interpolated) data, one can perform any interpolation (e.g., linear, polynomial, or any other).

Interpolation can be performed in either direction knowing only the contents c[n] of the cycle-swallowing counter 350. Two exemplary processes are described below.

Figure 7:
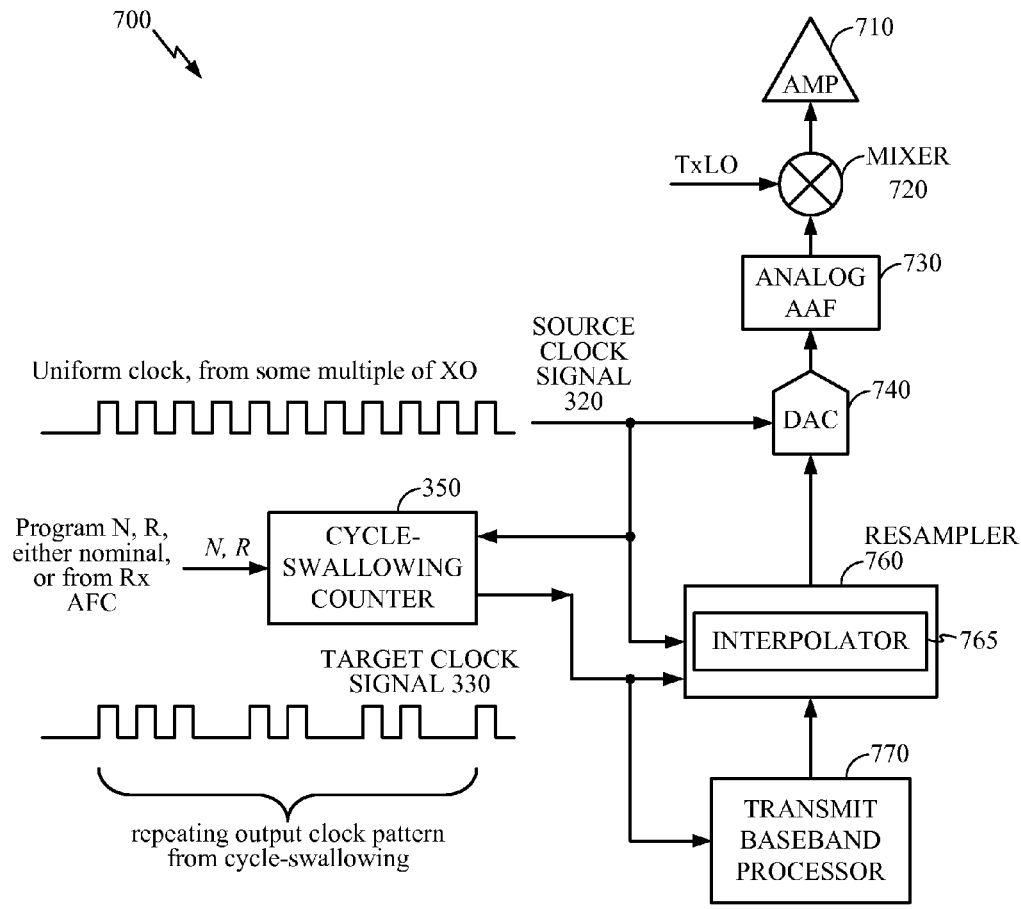
FIG. 7 is a conceptual block diagram illustrating an example of a hardware configuration for an electronic device utilizing a cycle swallowing counter for resampling data during a transmit operation according to one aspect of the disclosure.

(1) Resample data clocked by (or riding on) a real target clock signal 330 to data clocked by (or riding on) a source target clock signal 320. Data clocked by the real target clock signal 330 can be viewed as data clocked by (or riding on) the ticks of the hypothetical ideal target clock signal 630. This resampling process may occur during a data transmission operation—for example, resampling digital data prior to sending the data to a digital-to-analog converter (DAC) clocked by an even-clocking-cycle, but potentially frequency-offset source clock signal. An exemplary resampling operation is illustrated in FIG. 7. In a transmit baseband processor 770, data may be originally clocked by a real target clock signal 330. A resampler 760 may resample the data clocked by the real target clock signal 330 to data clocked by a source clock signal 320. This data may then be sent to a DAC 740 clocked by the source clock signal

320. As described above, a target (cycle-swallowed) clock signal 330 may have uneven cycles but can be automatically frequency controlled, thereby eliminating the effects of frequency offset present in a source clock signal 320.

Figure 8:
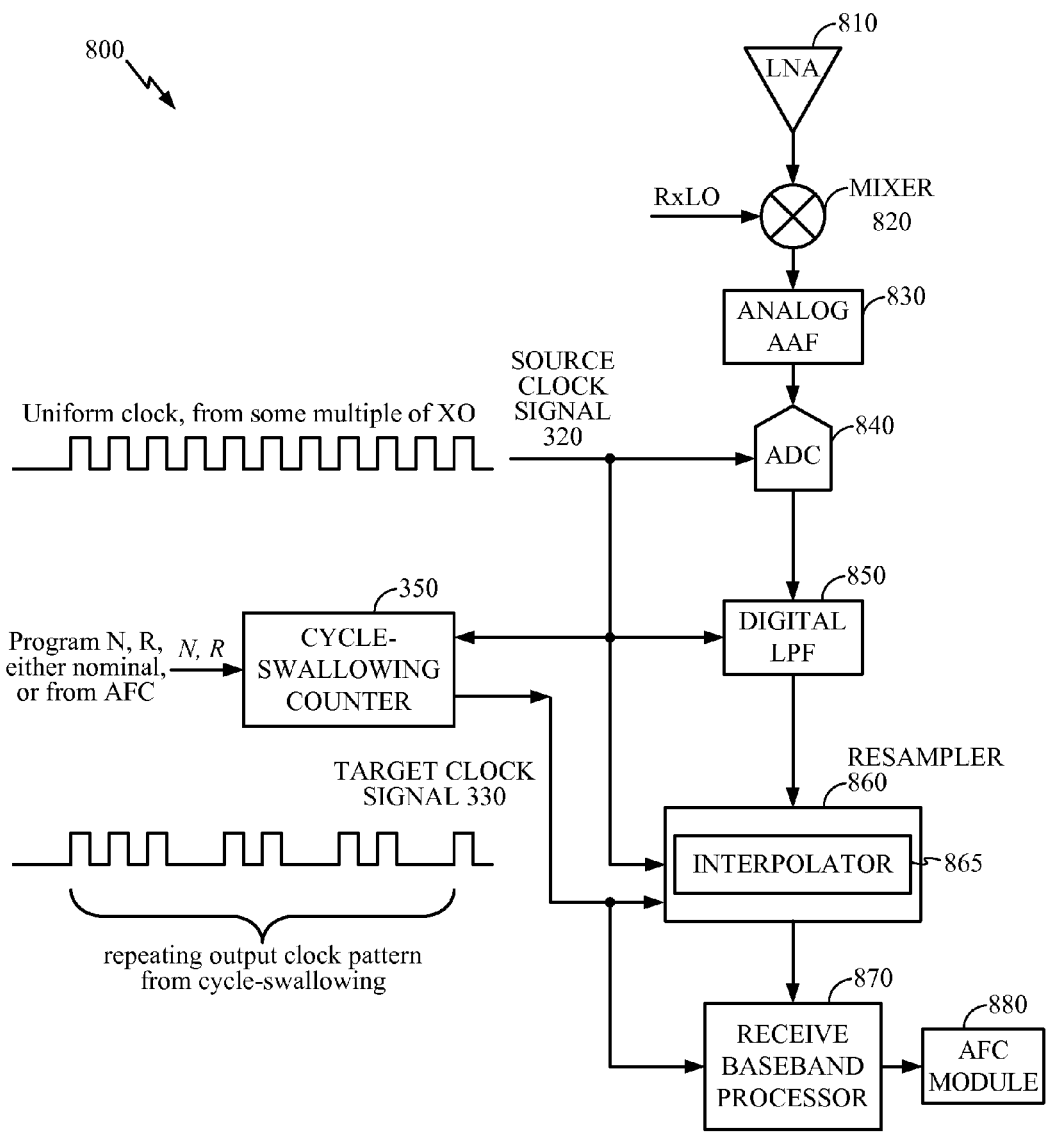
FIG. 8 is a conceptual block diagram illustrating an example of a hardware configuration for an electronic device utilizing a cycle swallowing counter for resampling data during a receive operation according to one aspect of the disclosure.

(2) Resample data clocked by (or riding on) an even-cycled but potentially frequency-offset source clock signal 320 to data clocked by (or riding on) an uneven-cycled, cycle-swallowed but "accurately-frequency-controlled" target clock signal 330. While the interpolator design may differ, the timing information needed for interpolation can be provided (e.g., solely) by the contents of a cycle-swallowing counter 350. This resampling process may occur during a data receiving operation—for example, resampling data after an analog-to-digital conversion operation is performed by an analog-to-digital converter (ADC), which may require even clocking to avoid spurs and is clocked by an even-cycle, but potentially frequency-offset source clock signal. An exemplary resampling operation is illustrated in FIG. 8. After an ADC 840, which is clocked by a source clock signal 320, performs an analog-to-digital conversion, a resampler 860 may resample data clocked by the source clock signal 320 to data clocked by a target clock signal 330.

In one aspect of the disclosure, even cycles may refer to, for example, clock cycles of a signal that have an approximately equal time duration, or clock cycles of a signal in which the time elapsed between any two consecutive ticks of the signal is approximately constant. In another aspect, even cycles may have time-varying frequency drift. In yet another aspect, even cycles may have time-varying frequency drift, where the amount of drift per cycle is substantially less than the duration of the cycle. In yet another aspect, the frequency of a signal having even cycles may vary slowly. In yet another aspect, even cycles may refer to, for example, approximately even cycles. In one aspect of the disclosure, uneven cycles may refer to, for example, clock cycles of a signal that have one or more unequal time intervals between certain consecutive ticks of the signal. In another aspect, when a second signal is generated by, or based on, swallowing (e.g., omitting or eliminating) one or more cycles of a first signal, then the second signal can be viewed as having uneven cycles. In yet another aspect, uneven cycles may refer to, for example, substantially uneven cycles. Resampling data can be sometimes referred to as translating, transforming, or converting data.

Exemplary Interpolation of Data: Linear Interpolation

In one aspect of the disclosure, an exemplary linear interpolation of data in both directions using the contents of a cycle-swallowing counter is illustrated below. The functionality of the cycle-swallowing and linear interpolation relationships can be described in the following pseudo-code.

For Every Tick of a Source Clock Signal:

```
n := n+1;            // this index is not cycle-swallowed, original (source) clock
c[n] = (c[n−1] + R) modulo N;
if( c[n] > c[n−1])   // if the counter has not overflown
    m := m+1;        // no cycle-swallowing, target clock signal must tick
endif                // otherwise, the counter overflowed, cycle is swallowed
if x-data is available and y-data is desired:
    // resample data from trgt_clk to src_clk, i.e., from target clock signal to
source clock signal
```

$$y[n] = x[m] \cdot \left(1 - \frac{c[n]}{N}\right) + x[m-1] \cdot \frac{c[n]}{N};$$

```
elseif y-data is available and x-data is desired:
    // resample data from src_clk to trgt_clk, i.e., from source clock signal to
target clock signal
```

$$x[m] = y[n-1] \cdot \left(1 - \frac{c[n-1]}{M}\right) + y[n] \cdot \frac{c[n-1]}{M};$$

```
    endif
endfor
```

The values N, M and R in the pseudo code shown above may be N, M and R as described above with reference to FIGS. 3, 4 and 5, where the average target frequency may be M/N of the source frequency. n may be the index of a source clock signal 320, m may be the index of a target clock signal 330, y[n] may be the data clocked by (or riding on) on the source clock signal 320, and x[m] may be the data clocked by (or riding on) the target clock signal 330.

Referring back to the exemplary operation shown in FIG. 6, if data is resampled from a first clock domain (e.g., the source clock signal 320) into a second clock domain (e.g., the target clock signal 330), then data is clocked by the clock signal of the second clock domain (e.g., the target clock signal 330) after the resampling. In addition, the data in the second clock domain may be determined from the data in the first clock domain by performing a linear (or any other) interpolation between two adjacent data in the first clock domain as follows: For example, the datum at the first tick of the source clock signal 320 may appear as the datum at the first tick of the target clock signal 330. The datum at the second tick and the datum at the third tick of the source clock signal 320 may be used to linearly interpolate the datum at the second tick of the target clock signal 330. The datum at the third tick and the datum at the fourth tick of the source clock signal 320 may be used to linearly interpolate the datum at the third tick of the target clock signal 330. The datum at the fifth tick and the datum at the sixth tick of the source clock signal 320 may be used to linearly interpolate the datum at the fourth tick of the target clock signal 330. Because there is an overflow at the fifth tick of the source clock signal 320, no interpolation is performed between the datum at the fourth tick and the datum at the fifth tick of the source clock signal 320. The pseudo-code presented above illustrates this operation.

If data is resampled from a second clock domain (e.g., the target clock signal 330) into a first clock domain (e.g., the source clock signal 320), then data is clocked by the clock signal of the first clock domain (e.g., the source clock signal 320) after the resampling. In addition, the data in the first clock domain may be determined from the data in the second clock domain by performing a linear interpolation between two adjacent data in the second clock domain. The pseudo-code presented above illustrates this operation.

The linear interpolation operation described above is just one exemplary scheme and can be implemented with only one multiplier in hardware according to one exemplary configuration. It should be noted that multiple multipliers and/or other components may be utilized in another configuration. In one aspect, the timing relationship between ticks of a source clock signal (even-period, but potentially with frequency-offset) and ticks of a target clock signal with the desired average frequency (even corrected for frequency-offset) can be provided by the contents of the cycle-swallowing counter c[n] at any point in time. In one aspect, this timing information is the only pre-requisite for any interpolation method. In another aspect, other information can be used as pre-requisite for an interpolation method.

Interpolation techniques other than linear interpolation (e.g., polynomial or other non-linear techniques) can be pursued at the expense of, for example, higher complexity. Such other interpolation techniques may be performed based on the contents of a cycle-swallowing counter (e.g., c[n], τ). Such techniques may also be based on data at two or more adjacent or non-adjacent ticks of the clock signal from which the data is being resampled. For example, data from more than two ticks of a first clock signal from which the data is being resampled can be used to determine the resampled datum at a given tick of a second clock signal. In this case, a delay can be added so that data from more than two ticks can be collected. These are merely some examples, and the subject technology may utilize other interpolation schemes.

Utilization of a Cycle-Swallowed Clock Signal in Transmit or Receive Operation

FIG. 7 is a conceptual block diagram illustrating an example of a hardware configuration for an electronic device utilizing a cycle swallowing counter for resampling data during a transmit operation. An electronic device 700 may include an amplifier (AMP) 710, a mixer 720, an analog anti-aliasing filter (AAF) 730, a digital-to-analog converter (DAC) 740, a resampler 760, a transmit baseband processor 770, and a cycle-swallowing counter 350. The resampler 760 may include an interpolator 765 configured to interpolate data using the contents of the cycle-swallowing counter 350. The interpolator 765 may be linear or non-linear. The resampler 760 may resample a series of data from one clock domain to another clock domain.

In the transmit baseband processor 770, data may be clocked by a target clock signal 330. The resampler 760 may receive a source clock signal 320 and a target clock signal 330. The resampler 760 may receive the data from the transmit baseband processor 770 and resample the data clocked by the target clock signal 330 to data clocked by a source clock signal 320. The data outputted by the resampler 760 may be sent to the DAC 740, which is clocked by the source clock signal 320. The signal output from the DAC 740 may be sent to the analog AAF 730, the mixer 720 (where the signal is mixed with a transmit local oscillator (TxLO) signal and up-converted) and then to the AMP 710. The signal may then be transmitted to another electronic device outside the electronic device 700 using, for example, the antenna 228 shown in FIG. 2.

The electronic device 700 may include some or all of the components shown in FIG. 2, or alternatively, the components shown in FIG. 7 may be incorporated into some of the components shown in FIG. 2. For example, the cycle-swallowing counter 350 in FIG. 7 may be incorporated into the processing system 202, the transmitter 208, or some combination thereof. The AMP 710, the mixer 720, the analog AAF 730, and the DAC 740 may be implemented in the transmitter 208. The resampler 760 and the transmit baseband processor 770 may be implemented in the processing system 202, the transmitter 208, or some combination thereof.

FIG. 8 is a conceptual block diagram illustrating an example of a hardware configuration for an electronic device utilizing a cycle swallowing counter for resampling data during a receive operation. An electronic device 800 may include a low noise amplifier (LNA) 810, a mixer 820, an analog anti-aliasing filter (AAF) 830, an analog-to-digital converter (ADC) 840, a digital lower pass filter (LPF) 850, a resampler 860, a receive baseband processor 870, an automatic frequency control (AFC) module 880, and a cycle-swallowing counter 350. The resampler 860 may include an interpolator 865 configured to interpolate data using the contents of the cycle-swallowing counter 350. The interpolator 865 may be linear or non-linear.

The LNA 810 may receive a signal from an electronic device outside the electronic device 800 through an antenna such as the antenna 226 in FIG. 2. The signal may be then mixed down by the mixer 820 using a receive local oscillator (RxLO). The signal may be sent to the analog AAF 830 and then to the ADC 840, which is clocked by a source clock signal 320. The output of the ADC 840 may be sent to the digital LPF 850. The resampler 860 may then take the data clocked by the source clock signal 320 and convert it to data clocked by a target clock signal 330. The data clocked by the target clock signal 330 may be processed by the receive baseband processor 870 using the target clock signal 330. The resampler 860 may the source clock signal 320 and the target clock signal 330.

The AFC module 880 may detect the frequency drift, and in response to the detection, the AFC module 880 may estimate the amount of the frequency drift in the source clock signal 320. The estimated information may be sent to a processor (e.g., a processing block in the processing system 202 in FIG. 2) that can generate values N' and R' described above. The cycle-swallowing counter 350 in FIG. 8 may receive values N, M and R, or values N', M and R'. In addition, the cycle-swallowing counter 350 in FIG. 7 for the transmit operation may receive values N, M and R, or values N', M and R'. The values N' and R' are derived from the estimated information generated by the AFC module 880 in FIG. 8. The process described in this paragraph may be performed automatically. In one aspect, the AFC module 880 may automatically determine the amount of the frequency drift in the source clock signal 320.

The electronic device 800 may include some or all of the components shown in FIG. 2, or alternatively, the components shown in FIG. 8 may be incorporated into some of the components shown in FIG. 2. For example, the cycle-swallowing counter 350 in FIG. 8 may be incorporated into the processing system 202, the receiver 206, or some combination thereof. The LNA 810, the mixer 820, the analog AAF 830, and the ADC 840 may be implemented in the receiver 206. The digital LPF 850, the resampler 860, the receive baseband processor 870, and the AFC module 880 may be implemented in the processing system 202, the receiver 206, or some combination thereof.

FIGS. 7 and 8 illustrate exemplary utilization of a cycle-swallowed target clock signal and the associated resampling operation in a transmitter and in a receiver. In these exemplary operations, at least two clock domains are maintained: one is an analog clock domain for analog processing (e.g., using a source clock signal 320), and one is a digital clock domain for digital processing (e.g., using a target clock signal 330). The source clock signal 320 may have even-clocking-cycles but may tend to drift in frequency with time. The target clock signal 330 may have uneven-clocking-cycles due to clock pulse (or clock cycle) swallowing but may be tightly frequency controlled. That a target clock signal has uneven clock cycles does not affect baseband processing or digital processing if the integrity of the data is maintained at the resampler 760 and 860. The integrity of data can be maintained by, for example, utilizing a data interpolation scheme described above. That a target clock signal can be accurately frequency controlled (no drifting) is a highly desirable property. As discussed above, a target clock signal can be accurately frequency controlled based on information, for example, from the automatic frequency control (AFC) module 880 shown in FIG. 8.

It should be noted that the subject technology may have multiple clock domains (e.g., more than two clock domains), where each clock domain has a different clock frequency. In one example, there may be one or more analog clock domains and one or more digital clock domains.

According to one aspect of the disclosure, a simple and efficient mechanism is provided with a cycle-swallowing counter that can generate a frequency or frequencies of one or more desired clock signals that are not necessarily harmonically related to the frequency or frequencies of the one or more available source clock signals. In another aspect, a cycle-swallowing counter can be utilized to generate a frequency or frequencies of one or more target clock signals that are (or can be) harmonically related to the frequency or frequencies of the one or more source clock signals. In such a case, the cycle-swallowing operation can be viewed as a frequency division.

In yet another aspect, a cycle-swallowing mechanism may be viewed as a mechanism that enables generation of a second clock domain (which is, for example, frequency-controlled, but with possibly uneven cycles) from a first clock domain (which is, for example, frequency-drifting, but with approximately even-duration clock cycles) and that enables resampling of data (e.g., transition of data) from one clock domain to another clock domain. Each of the clock domains may include one or more clock signals.

In yet another aspect, the constants N and M governing the relationship between the two frequencies can be chosen to approximate any frequency arbitrarily well, and to correct any frequency drift (frequency offset). In one aspect, a cycle-swallowing counter may be used to transform a source clock signal that tends to drift in frequency into an accurately frequency controlled target clock signal such that the target clock signal is more frequency stable than the source clock signal. The source frequency may be, for example, not less than the target frequency. Furthermore, the contents of a cycle-swallowing counter can support arbitrarily good digital data interpolation. A cycle-swallowing counter described herein may be very useful for the efficient design of modern multi-mode and multi-standard transceivers (possibly integrated) using a single frequency source for all target clock signals needed.

According to one aspect, very simple digital circuitry (e.g., a suitable counter) may be used to radically reduce the complexity and to derive clocking rates that are multiples of different fundamental symbol rates (and thus harmonically unrelated), as happens in modern multi-mode, multi-standard transceivers, which are becoming increasingly common in the marketplace. This multi-mode clock generation utilizing a cycle-swallowing counter can easily correct for frequency drift (or frequency offset) commonly present in clock sources and can aid with seamless digital data resampling from one clock domain to another.

While examples of the constants N and M are described above, it should be noted that N and M may be selected (or pre-selected or predetermined) in many different ways. In this regard, the constant R can be pre-selected or predetermined. As another example for determining N and M, suppose the source frequency is 70 MHz, and the target frequency is 61.44 MHz (i.e., 16×3.84 MHz), then N may be selected to be 7000, and M may be selected to be 6144. As an alternative, N may be selected to be 875, and M may be selected to be 768.

As yet another example for determining N and M, suppose the source frequency is 1,000,001 Hz, and the target frequency is 1,000,000 Hz, then N may be selected to be 1,000,001, and M may be selected to be 1,000,000. In this case, one cycle out of every 1,000,001 cycles is swallowed.

Figure 9A:
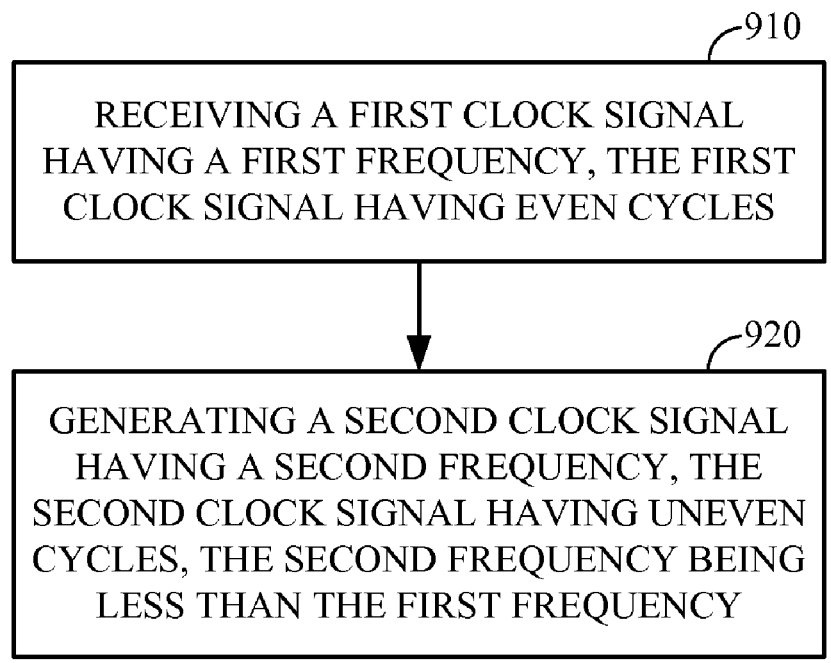
FIGS. 9A and 9B illustrate an exemplary method of generating or utilizing one or more cycle-swallowed clock signals derived based on one or more first clock signals according to one aspect of the disclosure.
Figure 9B:
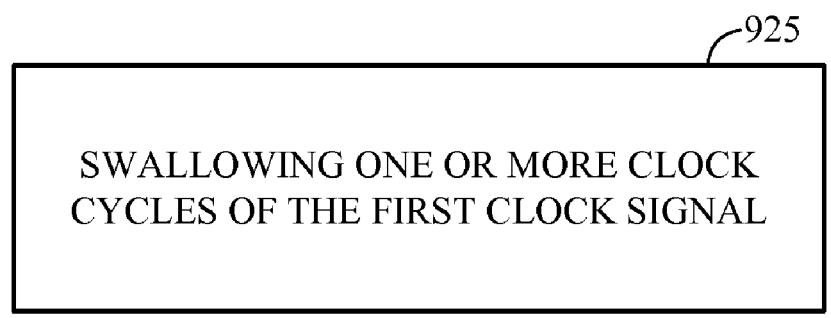

FIGS. 9A and 9B illustrate an exemplary method of generating or utilizing one or more cycle-swallowed clock signals derived based on one or more first clock signals according to one aspect of the disclosure. The method may be performed by an electronic device. The method comprises a process 910 for receiving a first clock signal having a first frequency. The first clock signal has even cycles. The method further comprises a process 920 for generating a second clock signal having a second frequency. The second clock signal has uneven cycles, and the second frequency is less than the first frequency. The process 920 comprises a process 925 for swallowing one or more clock cycles of the first clock signal.

Figure 10:
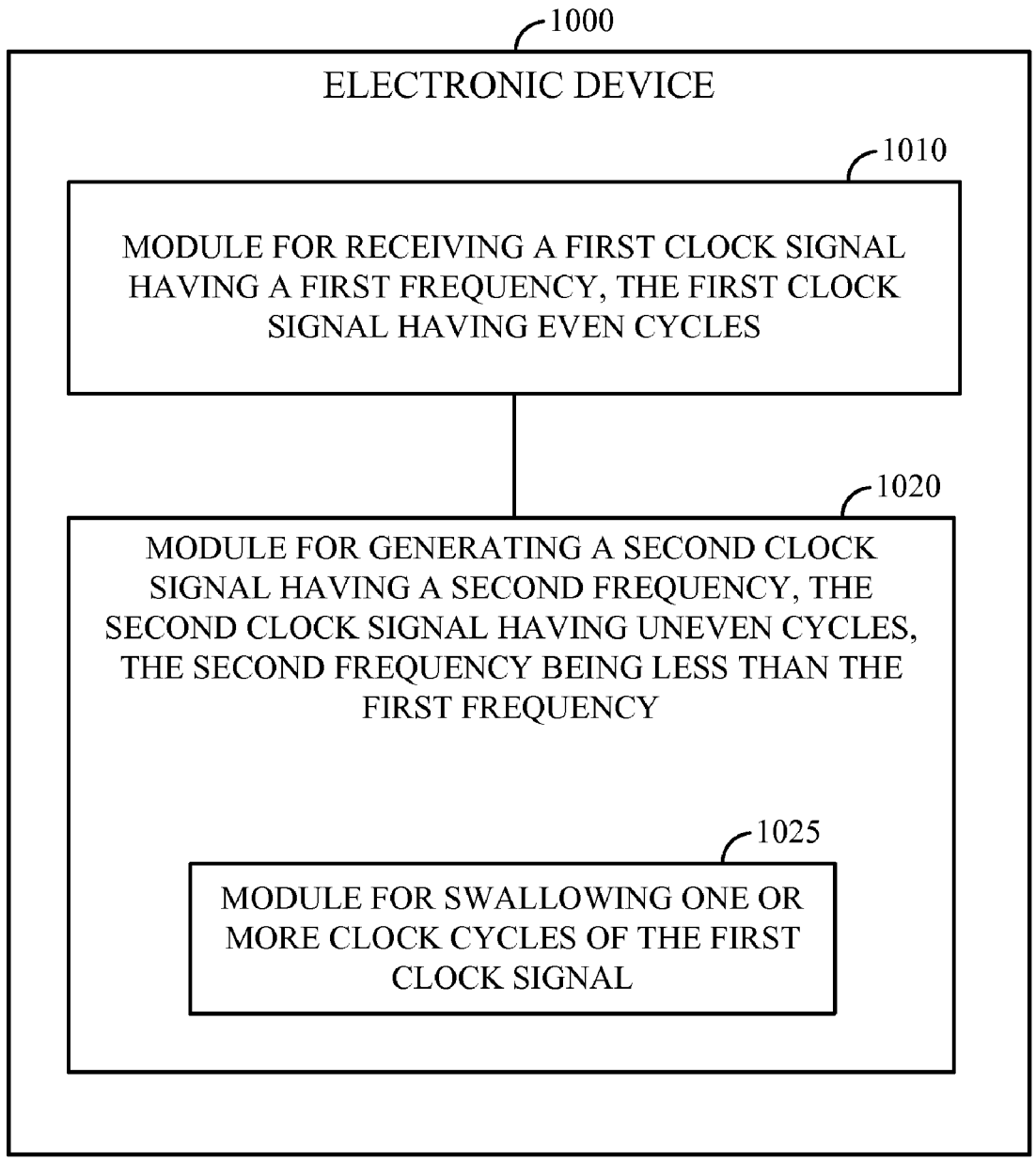
FIG. 10 is a conceptual block diagram illustrating an example of an electronic device for generating or utilizing one or more cycle-swallowed clock signals derived based on one or more first clock signals according to one aspect of the disclosure.

FIG. 10 is a conceptual block diagram illustrating an example of an electronic device for generating or utilizing one or more cycle-swallowed clock signals derived based on one or more first clock signals according to one aspect of the disclosure. An electronic device 1000 comprises a module 1010 for receiving a first clock signal having a first frequency. The first clock signal has even cycles. The electronic device 1000 further comprises a module 1020 for generating a second clock signal having a second frequency. The second clock signal has uneven cycles, and the second frequency is less than the first frequency. The module 1020 comprises a module 1025 for swallowing one or more clock cycles of the first clock signal.

Furthermore, the electronic device 1000 may comprise other components shown in FIG. 7 or 8. For example, the electronic device 1000 may comprise a module for interpolating data from a domain of the first clock signal to a domain of the second clock signal (e.g., the resampler 860 or the interpolator 865) or a module for interpolating data from a domain of the second clock signal to a domain of the first clock signal (e.g., the resampler 760 or the interpolator 765).

Figure 11:
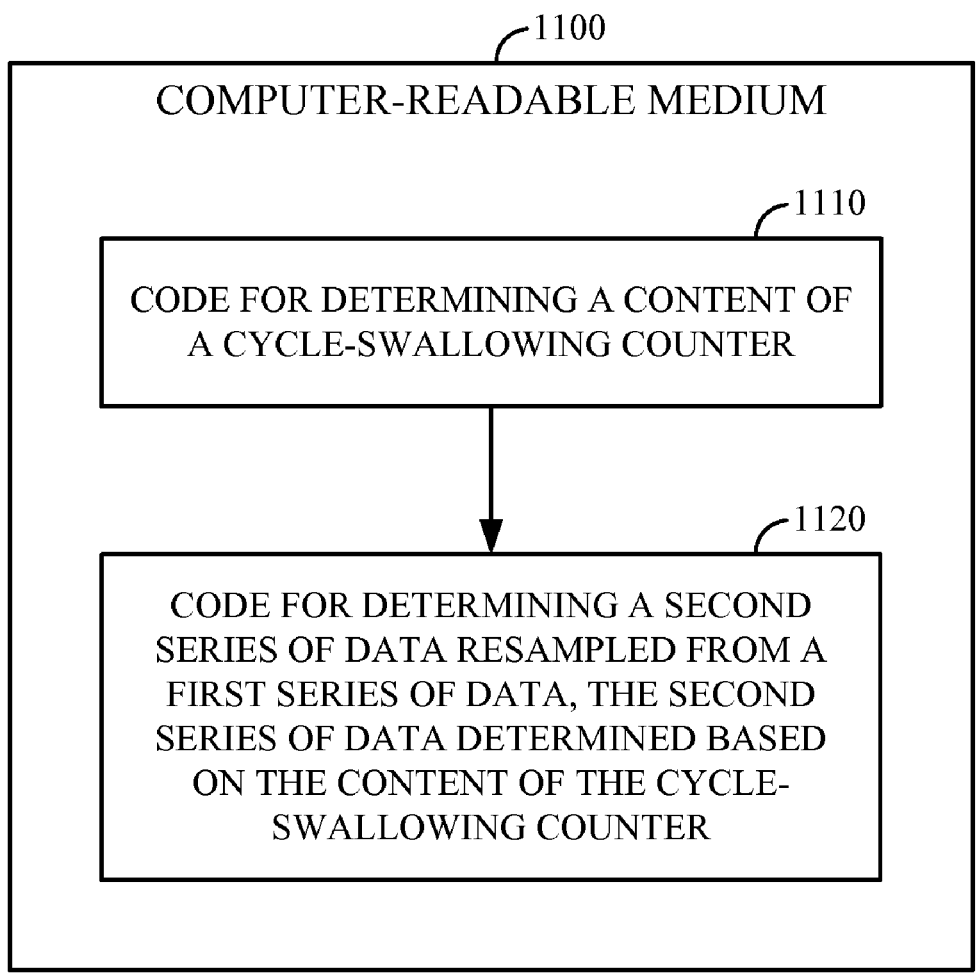
FIG. 11 is a conceptual block diagram illustrating an exemplary computer-readable medium comprising instructions executable by a processing system in an electronic device according to one aspect of the disclosure.

FIG. 11 is a conceptual block diagram illustrating an exemplary computer-readable medium according to one aspect of the disclosure. A computer-readable medium 1100 comprises instructions executable by a processing system in an electronic device. The instructions comprise code 1110 for determining a content of a cycle-swallowing counter and code 1120 for determining a second series of data resampled from a first series of data. The second series of data is determined based on the content of the cycle-swallowing counter. The cycle-swallowing counter is configured to receive a first clock signal having a first frequency, configured to generate a second clock signal having a second frequency, and configured to swallow one or more clock cycles of the first clock signal in generating the second clock signal. The second series of data is clocked by the first clock signal, if the first series of data is clocked by the second clock signal, and the second series of data is clocked by the second clock signal, if the first series of data is clocked by the first clock signal. The content of the cycle-swallowing counter is determined based on the first and second frequencies. In one aspect of the disclosure, code 1110 and code 1120 may be implemented in hardware.

Those of skill in the art would appreciate that the various illustrative functions including, for example, blocks, modules, elements, components, methods, and algorithms described herein may be implemented in hardware, software, firmware, or any combination thereof. Various functions may be arranged differently (e.g., arranged in a different order, or partitioned in a different way) all without departing from the scope of the subject technology.

If the functions are implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer.

By way of example, and not limitation, such computer-readable media can comprise random access memory (RAM), read only memory (ROM), erasable programmable read-only memory EPROM, CD-ROM or other optical disk storage, magnetic disk storage or other magnetic storage devices, or any other medium that can be used to carry or store desired program code in the form of instructions or data structures and that can be accessed by a computer. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

According to one aspect of the disclosure, a computer-readable medium is encoded or stored with instructions and is a computing element, which defines structural and functional interrelationships between the instructions and the rest of the system, which permit the instructions' functionality to be realized. Instructions may be executable, for example, by an electronic device or by a processor of an electronic device. Instructions can be, for example, a computer program including code. A computer-readable medium may comprise one or more media. The term computer may be understood to include a machine.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention. It should be noted that the term R as recited in the claims may refer to R or R' or both.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An electronic device for generating one or more cycle-swallowed clock signals derived based on one or more first clock signals, comprising:
    a module configured to receive a first clock signal having a first frequency, the module configured to generate a second clock signal having a second frequency, the module configured to swallow one or more clock cycles of the first clock signal in generating the second clock signal, wherein the second clock signal is one of the one or more cycle-swallowed clock signals and maintains a constant average frequency even when the first frequency of the first clock signal drifts.

2. The electronic device of claim 1, wherein the second frequency of the second clock signal is more stable than the first frequency of the first clock signal.

3. The electronic device of claim 1, wherein the module comprises a counter.

4. The electronic device of claim 1, wherein the second frequency is an average frequency of the second clock signal.

5. The electronic device of claim 1, wherein the first frequency is less than twice the second frequency.

6. The electronic device of claim 1, wherein the first clock signal has a frequency drift.

7. The electronic device of claim 6, wherein the second clock signal does not have the frequency drift.

8. The electronic device of claim 6, wherein the module is configured adaptively to correct for the frequency drift when generating the second clock signal.

9. The electronic device of claim 8, wherein adaptively correcting for the frequency drift comprises:
    reprogramming a nominal constant based on the one or more estimates of the frequency drift derived from the automatic frequency control (AFC) module; and
    generating the second clock signal based on the reprogrammed nominal constant.

10. The electronic device of claim 6, further comprising an automatic frequency control (AFC) module configured to determine an amount of the frequency drift.

11. The electronic device of claim 10, wherein, in generating the second clock signal, the module is configured to swallow one or more clock cycles of the first clock signal based on the amount of the frequency drift determined by the AFC.

12. The electronic device of claim 1, wherein the second clock signal is synchronous with the first clock signal.

13. The electronic device of claim 1, wherein the first clock signal is not harmonically related to the second clock signal.

14. The electronic device of claim 1, wherein the module comprises a modulo-N counter, wherein N is an integer such that a ratio N/M approximates the ratio of the first frequency and the second frequency, and wherein M is an integer.

15. The electronic device of claim 1, wherein the module comprises a modulo-N counter, wherein the module is configured to swallow R cycles of the first clock signal out of every N cycles of the first clock signal, wherein N is an integer whose ratio N/M approximates the ratio of the first frequency and the second frequency, wherein M is an integer, and wherein R is a difference between N and M.

16. The electronic device of claim 1, wherein the electronic device is configured to maintain a plurality of clock domains.

17. The electronic device of claim 1, wherein the first clock signal has even cycles, and the second clock signal has uneven cycles.

18. The electronic device of claim 1, wherein the first frequency is greater than the second frequency.

19. The electronic device of claim 1, further comprising:
a resampler configured to receive the first clock signal and the second clock signal, to receive a first series of data clocked at the first frequency, to generate a second series of data clocked at the second frequency, and to interpolate the first series of data to generate the second series of data.

20. The electronic device of claim 19, wherein the second series of data is generated based on the contents of the module.

21. The electronic device of claim 20, wherein the module comprises a modulo-N counter, and wherein the contents of the module comprise an output of the modulo-N counter.

22. The electronic device of claim 19, wherein the resampler is configured to receive the first series of data from a first clock domain, and the resampler is configured to generate the second series of data in a second clock domain.

23. The electronic device of claim 19, wherein the resampler comprises an interpolator.

24. The electronic device of claim 23, wherein the interpolator is a linear interpolator or a polynomial interpolator.

25. An electronic device for generating one or more cycle-swallowed clock signals derived based on one or more first clock signals, comprising:
a cycle-swallowing counter configured to be clocked by a first clock signal having a first frequency, the cycle-swallowing counter configured to generate a second clock signal having a second frequency, the cycle-swallowing counter configured to swallow one or more clock cycles of the first clock signal in generating the second clock signal, wherein the second clock signal is one of the one or more cycle-swallowed clock signals and maintains a constant average frequency even when the first frequency of the first clock signal drifts.

26. The electronic device of claim 25, wherein the cycle-swallowing counter is configured to be incremented at each clock cycle of the first clock signal.

27. The electronic device of claim 25, wherein the cycle-swallowing counter is configured to swallow one or more clock cycles of the first clock signal in generating the second clock signal if the cycle-swallowing counter overflows.

28. The electronic device of claim 25, wherein the cycle-swallowing counter comprises a modulo-N counter, wherein the cycle-swallowing counter is configured to increment based on R, wherein N is an integer such that a ratio N/M approximates the ratio of the first frequency and the second frequency, wherein M is an integer, and wherein R is a difference between N and M.

29. The electronic device of claim 25, wherein the first clock signal has even cycles, and the second clock signal has uneven cycles.

30. The electronic device of claim 25, wherein the first clock signal has a frequency drift, and the second clock signal does not have the frequency drift.

31. The electronic device of claim 30, wherein the cycle-swallowing counter is configured adaptively to correct for the frequency drift when generating the second clock signal, based on one or more estimates of the frequency drift derived from an automatic frequency control (AFC) module.

32. The electronic device of claim 25, further comprising:
a resampler configured to receive the first clock signal and the second clock signal, to receive a first series of data clocked at the first frequency, to generate a second series of data clocked at the second frequency, and to interpolate the first series of data to generate the second series of data.

33. The electronic device of claim 32, wherein the resampler comprises an interpolator.

34. The electronic device of claim 25, wherein the first frequency is greater than the second frequency.

35. A method of generating one or more cycle-swallowed clock signals derived based on one or more first clock signals, comprising:
receiving a first clock signal having a first frequency;
generating a second clock signal having a second frequency;
receiving a first series of data clocked at the first frequency; and
generating a second series of data clocked at the second frequency,
wherein the generating comprises swallowing one or more clock cycles of the first clock signal and interpolating the first series of data, wherein the second clock signal is one of the one or more cycle-swallowed clock signals and maintains a constant average frequency even when the first frequency of the first clock signal drifts.

36. The method of claim 35, wherein the generating is performed by a cycle-swallowing counter comprising a modulo-N counter, wherein the generating comprises incrementing the cycle-swallowing counter based on R, wherein N is an integer such that a ratio N/M approximates the ratio of the first frequency and the second frequency, wherein M is an integer, and wherein R is a difference between N and M.

37. The method of claim 35, wherein the first clock signal has a frequency drift, and the second clock signal does not have the frequency drift.

38. The method of claim 37, wherein the generating comprises:
detecting the frequency drift;
estimating an amount of the frequency drift in response to the detection; and
adaptively correcting for the frequency drift based on the amount of the frequency drift when generating the second clock signal.

39. The method of claim 37, wherein the generating a second clock signal comprises swallowing one or more clock cycles of the first clock signal based on an amount of the frequency drift.

40. The method of claim 35, wherein the first clock signal has even cycles, and the second clock signal has uneven cycles.

41. The method of claim 35, wherein the second frequency is less than the first frequency.

42. An electronic device for generating one or more cycle-swallowed clock signals derived based on one or more first clock signals, comprising:
- means for receiving a first clock signal having a first frequency;
- means for generating a second clock signal having a second frequency;
- means for receiving a first series of data clocked at the first frequency; and
- means for generating a second series of data clocked at the second frequency,
- wherein the means for generating the second series of data comprises means for swallowing one or more clock cycles of the first clock signal and means for interpolating the first series of data, wherein the second clock signal is one of the one or more cycle-swallowed clock signals and maintains a constant average frequency even when the first frequency of the first clock signal drifts.

43. The electronic device of claim 42, wherein the means for generating the second clock signal further comprises a cycle-swallowing counter, wherein the cycle-swallowing counter comprises a modulo-N counter, wherein the cycle-swallowing counter is configured to increment based on R, wherein N is an integer such that a ratio N/M approximates the ratio of the first frequency and the second frequency, wherein M is an integer, and wherein R is a difference between N and M.

44. The electronic device of claim 42, wherein the first clock signal has a frequency drift, and the second clock signal does not have the frequency drift.

45. The electronic device of claim 44, wherein the means for generating the second clock signal comprises:
- means for detecting the frequency drift;
- means for estimating an amount of the frequency drift in response to the detection; and
- means for adaptively correcting for the frequency drift based on the amount of the frequency drift when generating the second clock signal.

46. The electronic device of claim 44, wherein the means for swallowing one or more clock cycles of the first clock signal is configured to swallow one or more clock cycles of the first clock signal based on an amount of the frequency drift.

47. The electronic device of claim 42, wherein the first clock signal has even cycles, and the second clock signal has uneven cycles.

48. The electronic device of claim 42, wherein the second frequency is less than the first frequency.

49. A non-transitory computer-readable medium comprising instructions executable by a processing system in an electronic device, the instructions comprising code for:
- determining a content of a cycle-swallowing counter; and
- determining a second series of data resampled from a first series of data, the second series of data determined based on the content of the cycle-swallowing counter,
- wherein the cycle-swallowing counter is configured to receive a first clock signal having a first frequency, configured to generate a second clock signal having a second frequency, and configured to swallow one or more clock cycles of the first clock signal in generating the second clock signal, wherein the second series of data is clocked by the second clock signal, wherein the first series of data is clocked by the first clock signal,
- wherein the content of the cycle-swallowing counter is determined based on the first and second frequencies,
- wherein the determining the second series of data comprises interpolating the first series of data, and
- wherein the second clock signal maintains a constant average frequency even when the first frequency of the first clock signal drifts.

50. The non-transitory computer-readable medium of claim 49, wherein the content of the cycle-swallowing counter is incremented by a predetermined amount at every cycle of the first clock signal.

* * * * *